United States Patent [19]
Sondermeyer

[11] Patent Number: 5,387,876
[45] Date of Patent: Feb. 7, 1995

[54] HIGH EFFICIENCY AMPLIFIER WITH REDUCED SWITCHING DISTORTION

[75] Inventor: Jack C. Sondermeyer, Meridian, Miss.

[73] Assignee: Peavey Electronics Corporation, Meridian, Miss.

[21] Appl. No.: 169,353

[22] Filed: Dec. 20, 1993

[51] Int. Cl.$^6$ .......................... H03F 3/38; H03F 3/26
[52] U.S. Cl. ................................ 330/251; 330/267
[58] Field of Search ............. 330/10, 251, 267, 268, 330/297

[56] References Cited

U.S. PATENT DOCUMENTS

| | | | |
|---|---|---|---|
| 3,961,280 | 6/1976 | Sampei | 330/40 |
| 4,001,707 | 1/1977 | Iguchi | 330/18 |
| 4,115,742 | 9/1978 | Yokoyama | 330/297 |
| 4,160,216 | 7/1979 | Thornton | 330/267 |
| 4,329,657 | 5/1982 | Kamiya | 330/297 |
| 4,481,482 | 11/1984 | Vassilev et al. | 330/297 |
| 4,494,078 | 1/1985 | Vassilev et al. | 330/297 |
| 4,688,001 | 8/1987 | Dijkmans et al. | 330/273 |
| 4,706,035 | 11/1987 | Dijkmans et al. | 330/156 |
| 4,706,039 | 11/1987 | Dijkmans et al. | 330/297 |
| 4,721,919 | 1/1988 | LaRosa et al. | 330/146 |
| 4,733,194 | 3/1988 | Roehrs et al. | 330/251 |
| 4,748,421 | 5/1988 | Schilling et al. | 330/251 |
| 5,115,203 | 5/1992 | Krett et al. | 330/251 |
| 5,194,821 | 3/1993 | Brambilla et al. | 330/51 |
| 5,225,789 | 7/1993 | Caine et al. | 330/10 |

OTHER PUBLICATIONS

Sampei et al., Highest Efficiency and Super Quality Audio Amplifier Using MOS Power FETs in Class G Operation, pp. 1-7 1977.

Primary Examiner—Steven Mottola
Attorney, Agent, or Firm—Watson, Cole, Grindle & Watson

[57] ABSTRACT

An amplifier switchably operative in a plurality of voltage modes depending upon the level of the input signal is disclosed. A circuit for each voltage mode includes a common driver for each level and a plurality of output devices arranged in parallel. Each output device is operative at a selected voltage level and is coupled to the common driver for the corresponding voltage mode. One output device of each level is coupled in series to an output device of the next lower level. A switching diode circuit is coupled between series connected outputs of each output device. In one embodiment, paired diodes are coupled to each level in a common terminal of the diodes are coupled to the input. A regulator is provided for causing the driver and the output devices of each next higher level to turn on prior to the input signal achieving a selected voltage level. The circuit thus provides smooth switching between levels with reduced distortion.

18 Claims, 3 Drawing Sheets

HIGH EFFICIENCY AMPLIFIER WITH REDUCED SWITCHING DISTORTION

BACKGROUND OF THE INVENTION

The invention relates to power amplifiers. In particular, the invention relates to a switchable amplifier operating between at least two power levels which has reduced switching distortion, fast response time and improved power handling.

A class-G power amplifier disclosed in Sampei, U.S. Pat. No. 3,961,280, switches between two levels of rail voltages (two positive and two negative rails) to provide a more efficient and cooler running design than single rail voltage approaches (with one positive and one negative rail). At idle and at relatively low signal conditions, the class-G power amplifier uses the low supply rails. As signal conditions increase, i.e., when the output swing exceeds the lower supply rail voltage, the amplifier automatically switches to the higher supply rails for that portion of the output swing that exceeds the lower rail voltage. This approach improves the overall efficiency of the design because for a large portion of the signal conditions, the amplifier uses the low voltage rails which are typically one-half the voltage of the high voltage rails. As a result, the input power, and ultimately the power dissipation is less than that of the conventional class-AB approach. At lower power levels, power dissipation is approximately one-half of the class-AB value. Thus, with the same output power level, a switchable class-G design can use smaller heat sinks and power transformers than a comparable class-AB design.

Most known class-G amplifier designs, however, have severe performance limitations at high frequencies. Typical slew (switching) rate values are low, and the total harmonic distortion (THD) is high due to device switching limitations. In known arrangements, for example, switching is accomplished by a diode and a pair of power transistors. The saturation and switching characteristics of such devices determine the transient response of the output signal at the rail transition and limits the speed at which the output can slew from rail to rail.

FIG. 3 shows the basic circuit of a known class-G amplifier, similar to Sampei above. In the arrangement, two different voltage supplies $V_L$ and $V_H$ representative of the respective low and high power supplies (rails) are coupled to a pair of corresponding amplifiers $Q_L$ and $Q_H$ connected in series, as shown, with the emitter of $Q_H$ coupled to the collector of $Q_L$. A switching diode $D_S$ is connected between the series connection of the amplifiers $Q_H$ and $Q_L$, as shown, and to the lower voltage supply $V_L$. A similar arrangement is provided on the complementary or opposite polarity side using respective negative low and high voltages, $-V_L$ and $-V_H$ and amplifiers $Q_L'$ and $Q_H'$, which are devices of opposite conductivity type as illustrated.

In the arrangement illustrated in FIG. 3, the device $Q_H$ or $Q_H'$ is referred to as the upper device and the device $Q_L$ or $Q_L'$ is referred to as the lower device. When the input signal $V_{in}$ is less than the lower rail voltage $V_L$, the upper device $Q_H$ is cut off, and the lower device $Q_L$ supplies output current via $D_S$ which is forward biased. When the input signal exceeds the lower voltage $V_L$ the upper device $Q_H$ is turned on. When this happens, the switching diode $D_S$ is reverse biased and cuts off the current from the lower voltage $V_L$ for that portion of the output signal swing that exceeds $V_L$. The diodes $D_L$ and $D_H$ which are in the respective base circuits of the lower and upper devices, establish a voltage relationship between the devices so that the lower device $Q_L$ is prevented from going into saturation.

Attempts have been made to improve the efficiency and performance of class-G operation. For example, Dijkmans et al., U.S. Pat. No. 4,706,035, shows two level output (two positive and two negative) class-G amplifier with a bootstrap capacitor for driving the output up to the second supply voltage. A switching diode is in the output circuit of the low voltage source. A series diode circuit is provided between the bases of the output devices. Although the bootstrap circuit improves output swing, the upper output device still becomes saturated, thereby reducing the system performance.

In class-G operation switching distortion will occur twice each half-cycle as the input signal $V_{in}$ increases above or decreases below the lower voltage $V_L$. The distortion caused in conventional class-G operation is due to switching delays occurring at such transitions.

SUMMARY OF THE INVENTION

The present invention is based upon the discovery that an amplifier operating in plural voltage modes may be implemented with reduced switching distortion and improved power handling by means of parallel device outputs with separate switching diodes. There is also provided means for preventing saturation of the output devices in each of the various voltage modes. In addition, a broadband improvement in switching speed and a reduction in switching distortion may be achieved by maintaining a small input drive current in a predetermined relationship with respect to the output so that the upper devices are forced into a low conduction state prior to switching between the modes.

In one embodiment, the invention is directed to an amplifier switchably operative in plurality of voltage modes depending on the level of the input signal. The amplifier comprises a common driver for each level, a plurality of output devices arranged in parallel, each operative at a selected voltage level and being coupled to the common driver for the corresponding voltage mode. One output device of each parallel circuit is connected in series to the output device of the next adjacent voltage level. Switching diode means is coupled to a node between series connected output devices at each voltage level.

In another embodiment, the invention is directed to an amplifier for switching between voltage modes which includes a driver and a output device for each voltage level. The output devices are connected in series. Means for preventing saturation of the common driver and the output devices in each level is provided.

In another embodiment, the invention is directed to an amplifier switchably operative in various voltage modes, each mode including a driver and an output device. Each output device is connected in series between the voltage levels and means is coupled to the input of at least one of the drivers and the output causing the driver to conduct prior to switching between the levels.

The present invention is designed to moderate the inherent distortion caused by effects of switching at high frequencies, and to improve the performance of class-G operation by providing a combination of features not presently available in conventional systems. In particular, the invention provides for parallel upper and lower output devices for improved power handling at the intended output power levels. An individual switching diode is coupled to each pair of upper and lower output devices to reduce the switching distortion which would occur if only one switching diode were employed with plural output devices. In addition, each amplifier has a common emitter resistor to enforce current sharing. The separate switching diodes allow for the elimination of separate emitter resistors for both the upper and lower devices which might otherwise be required to force current sharing.

In the present invention, nonsaturating circuitry is provided for both the upper and the lower devices to improve the slew rate or switching capability of the devices. In the prior art, saturation is not fully considered and once it occurs in a power transistor, the switching time is increased by about an order of magnitude or more.

As an additional important feature of the invention, low distortion switching is achieved by means of circuitry which causes the upper power devices to turn on with a relatively low current prior to the point where the input signal makes a transition above or below a reference, e.g., the lower voltage rail. In other words, prior to the input signal exceeding the low rail voltage, the upper device is turned on slightly so that when full voltage switching occurs, it is accomplished with negligible switching distortion. Likewise, when the input signal decreases to near the lower rail voltage the upper devices remain turned on during the transition with low current flow so that again switching occurs with virtually no distortion. The foregoing arrangement is achieved at low as well as high frequencies.

DESCRIPTION OF THE INVENTION

Figure 1:
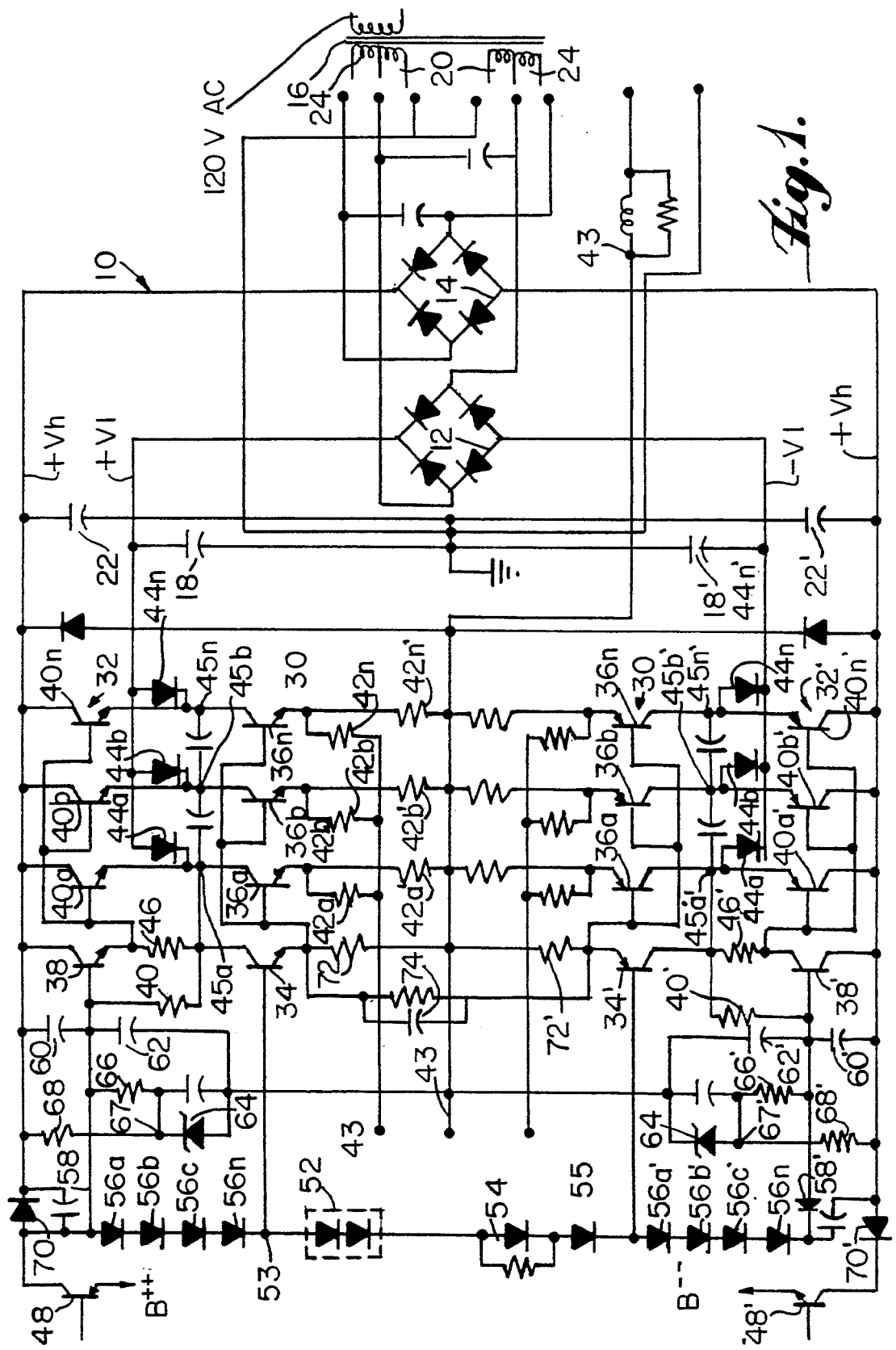
FIG. 1 is a schematic diagram illustrating a high efficiency amplifier with low switching distortion according to one embodiment of the invention employing a grounded supply.

FIG. 1 illustrates an embodiment a high efficiency amplifier with reduced switching distortion of the invention using, for ease of description, a so-called grounded supply approach. In the present invention, there is provided bipolar, [i.e., plus (+) and minus (−)] lower rail voltages $V_L$ and +/− upper rail voltages $V_H$ which are generated from respective full wave bridge rectifiers 12 and 14 supplied from a center-tap transformer 16. Filter capacitors 18, 18' store the rectified voltage from the lower windings 20 of the transformer 16 for the low rails +/− $V_L$. Likewise, the filter capacitors 22, 22' store the rectified voltage from the upper windings 24 of the transformer 16 for the upper rails +/− $V_H$ as illustrated. Typically, the lower windings 20 have half as many turns as the upper windings 24. The transformer 16 is shown connected to a conventional 120 volt supply.

The present invention includes respective sets of lower devices 30 and upper devices 32. The lower devices include a driver 34 and a plurality (at least two) of lower output devices 36A–36N. The emitter of the driver 34 is commonly coupled to the base of each of the lower output devices 36A–36N in a Darlington configuration. Likewise, the upper devices 32 comprise a driver 38 in a common Darlington configuration with a plurality of upper output devices 40A–40N. On the negative side, the devices are of the opposite conductivity type, as illustrated, and are labeled with primed (') reference numerals corresponding to similar elements on the upper side. The lower output devices 36A–36N and the upper output devices 40A–40N will be referred to without letter designations unless reference to a particular device is required.

In FIG. 1, each lower device 36 is coupled with a corresponding upper device 40 in series, as illustrated. For example, the lower device 36A has its collector coupled to the emitter of the upper device 40A. Each lower device 36A–36N has its emitter coupled to an corresponding emitter resistor 42A–42N, and to the common output lead 43, as illustrated. The emitter and collector of each pair of series connected devices 36A, 40A–36N, 40N form a corresponding node 45A–45N. A corresponding switching diode 44A–44N are coupled between the corresponding node 45A–45N, and commonly to the lower voltage $V_L$.

The input signal swing is provided by a pair of predrivers 48, 48', which are coupled across the circuit by means of a bias string 53 comprising series connected diodes 56A–56N, double diode 52, diode resistor combination 54, diode 55 and series connected diodes 56A'–56N' connected between a bias supply B++, B−−, as shown.

The bases of the upper and lower drivers 38 and 34 are coupled by a set of series connected diodes 56A–56N, forward biased with respect to the driver 34, and a diode 58, reverse biased with respect to driver 38. The upper driver 38 is coupled between the upper rail $V_H$ and the output 43 by a pair of series connected capacitors 60 and 62. In addition, the base of the driver 38 is coupled to the output 43 by means of zener diode 64 and resistor 66. Resistor 68 supplies current to the zener diode 64 from the upper rail $V_H$ as shown.

As noted above, the upper and lower portions of the circuit 10 are true mirror images of each other with the devices either being poled oppositely or being of opposite conductivity type. Accordingly, in the description below, unless necessary, only the upper half of the circuit 10 is described.

At power on, but at zero input signal conditions, the amplifier 10 operates from the low voltage supply $V_L$ as follows. On the positive side, the collector of the Darlington driver 34 and the output devices 36A–36N are all at the lower voltage +$V_L$ less one diode drop which is established by the switching diodes 44A–44N. Similarly, on the negative side, the Darlington driver 34', the output device 36A'–36N' are all at −$V_L$ less one diode drop via switching diodes 44A'–44N'. The arrangement is a complementary power amplifier with +/− $V_L$ rails and with an idle current value determined by the bias string diodes 52, 55 and resistor diode combination 54.

The lower drivers 34, 34' have corresponding common emitter resistors 72, 72' series connected to the output 43, as illustrated. Likewise, on the lower side, the emitters of drivers 34, 34' are coupled by a resistor capacitor combination 74 in parallel with the common emitter resistors 72, 72'. These components are employed to turn off the outputs during alternate cycles of operation, e.g., in typical class-B fashion. Thus, each of the lower devices 30 are coupled to the output 43 by means of the emitter resistors 42A–42N and 42A'–42N', which force current sharing between the output devices 40A–40N and 40A'–40N', respectively to the output 43.

In the signal driven system in accordance with FIG. 1, the positive and negative pre-drivers 48–48' provide adequate signal swing to drive the amplifier 10 to the full upper rail voltage $V_H$ via upper devices 32. For output swings up to but not to exceed $V_L$, the complementary pre-drivers 48, 48' and the corresponding lower devices 30 provide an amplified signal powered from voltage rail $V_L$.

When peak the output signal exceeds the lower voltage $+V_L$, on the positive side, for example, the driver 38 and the upper output devices 40A–40N are turned on for any portion of the voltage swing greater than $V_L$. On the negative side, the driver 38' and upper output devices 40A'–40N' are driven on for any swing greater than $-V_L$. During these peak signal swings, the output current is supplied momentarily by the $+/- V_H$ rails. The $+/- V_L$ supplies are momentarily idle. When the signal drops below $+/- V_L$, then the lower rails take over. During those signal conditions which exceed $+/- V_L$ the upper output devices 40 raise the collector voltage of the lower amplifiers 36 above the $+/- V_L$. At the same time, the collector to emitter voltage of each lower device 36A–36N is maintained at a nonsaturated low voltage value by the series connected diodes 56A–56N.

An important feature of the invention is the employment of separate switching diodes 44A–44N for each device 36A–36N, which provide significant improvement in the switching time. Separate diodes may be employed which are smaller and have a lower rating than a single common switching diode. Accordingly, they are not only physically small and lower in cost, but from a performance standpoint, they switch at a higher rate and store less energy, greatly reducing distortion. At the same time, the separate switching diodes 44A–44N enable the emitter resistors 42A–42N in emitter circuit of the lower devices 36A–36N to be commonly used in the emitter circuit of the upper devices 40A–40N, whereby the output currents can be shared. This eliminates the need for additional emitter resistors for use with the upper devices 40A–40N which is a significant saving both in parts requirements and circuit board real estate.

Switching distortion occurs during the transition around $V_L$. Such distortion results from a number of factors. First, there is distributed inductive impedance in the circuit elements and capacitive impedance especially associated with the switching diodes 44. In order to minimize the switching distortion, it is useful to gradually turn on or turn off the upper devices 40 prior to the voltage transition. For example, at high frequencies, a pair of series capacitors 60 and 62 establish a voltage divider circuit. The capacitors 60 and 62 are coupled between the high rail $V_H$ and the output 43. The base of the driver 38 is coupled to the node between the capacitors 60 and 62. At high frequencies, the capacitors 60 and 62 act as a reactance whereby a current is supplied to the base of the driver 38 as the output voltage increases. Accordingly, at high frequency the driver 38 is fully turned on causing the upper output devices 40A–40N to amplify the incoming signal at all input signal levels. While this arrangement is not, strictly speaking, pure class-G operation and sacrifices some efficiency, it is useful at high frequencies to eliminate switching distortion altogether. In essence, then the upper devices 32 operate independently as a high power amplifier at high frequency, e.g., about 10,000 KHz. At lower frequencies, e.g., about 1 KHz, however, it is not desirable to turn the upper devices 32 full on unless the input signals exceed $V_L$. Accordingly, a low frequency circuit is provided to gradually turn on the upper driver 38 and the devices 40A–40N before the transition above $V_L$. The circuit includes a series connection of zener diode 64 and upper rail dropping resistor 68. The node 67 between the diode 64 and resistor 68 is coupled via resistor 66 to the base of the driver 38. The zener diode 64 has a fixed voltage drop which establishes the node 67 at a fixed voltage above the output 43. As the output signal increases, the voltage node at 67 increases causing the current to flow in the base of driver 38. This causes the driver 38 to conduct. The degree to which the driver 38 conducts, however, is a function of the base current. The amount of current in the base is greatly limited by the resistor 66. Accordingly, the driver 38 is in a low conducting state prior to the input signal transition above $V_L$. The switching transition is anticipated, because the upper device is turned on. As a result, the driver 38 and the upper output devices 40A–40N more gradually switch from the low rail voltage $V_L$ to the high rail voltage $V_H$, resulting in significantly reduced switching distortion. In addition, because there is a current in the emitter of the upper devices 32, the switching diodes 44 switch at a higher speed and with less delay. As the signal voltage decreases and approaches $V_L$ there is a delay, such that, the upper devices 32 remain on slightly after the voltage transfers to the lower rail $V_L$. Such an arrangement softens the switching distortion providing a smoother transition.

Another feature of the invention is the prevention of saturation in both the lower devices 30 and the upper devices 32. This is accomplished by means of diode circuits in the base/collector circuits of both the lower and upper devices 30 and 32. The base/collector circuit of the upper driver 38 contains paired diodes 58 and 70. The purpose of the diode pair is to force driver current into the collector of driver 38 through diode 70 whenever the collector/emitter voltage of the driver 38 reaches a selected value greater than the saturation voltage.

In the lower devices 30 the diode string 56 is in the base circuit of the lower driver 34, and the diode 58 is paired with the diode string 56 in the base circuit of the upper driver 38. When the input signal matches or exceeds the lower rail voltage $V_L$, the base diode 58 becomes forward biased turning on the upper device 38. In this arrangement, the voltage difference between the collector and the base of the lower driver 34 is minimized to a value of the sum of the voltage drops of the diode string 56 minus the voltage drop of the base diode 58 which is forward biased. In this way, the driver 34 is prevented from being driven into saturation, hence its switching time is greatly improved.

According to the invention the lower devices 30 and the upper devices 32 are prevented from going into saturation, a condition where the increased drive current causes the devices to achieve a minimum collector to emitter voltage $V_{CE(SAT)}$. Thus, by preventing saturation, the output recovery speed is greatly enhanced permitting switching or slew rate values in excess of 40 volts per micro-second. Typically, recovery speeds are ten times larger if saturation is permitted to occur and a slew rate of 40 volts per microsecond would be impossible and the distortion would be high.

Figure 2:
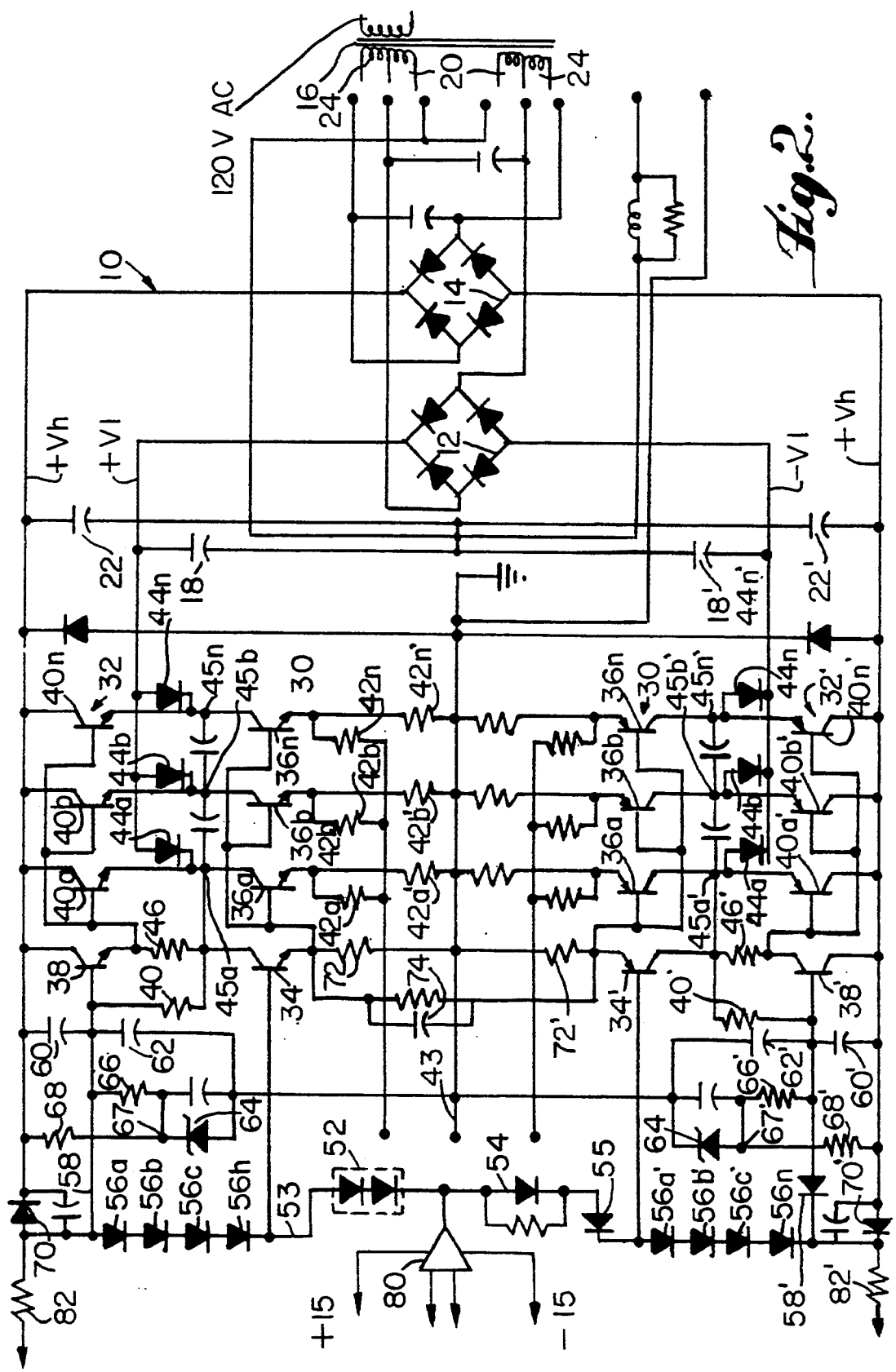
FIG. 2 is a schematic diagram of a high efficiency amplifier with low switching distortion in accordance with another embodiment to the invention employing a driven power supply.
Figure 3:
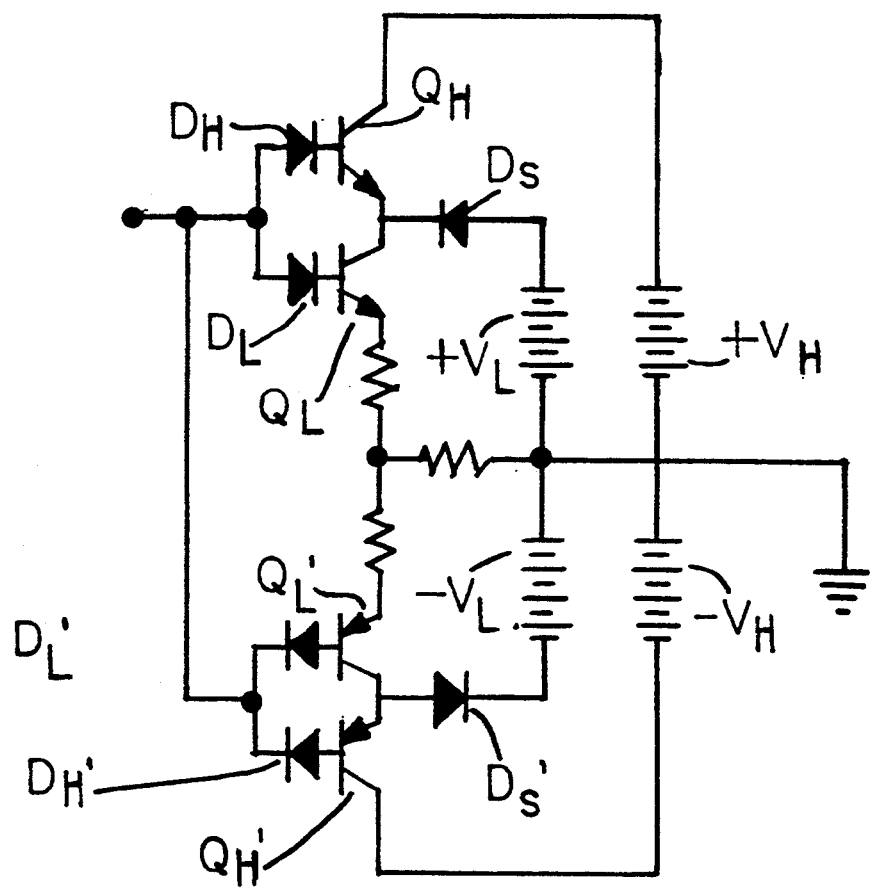
FIG. 3 is a schematic diagram illustrating a conventional class-G amplifier.

FIG. 2 is similar to FIG. 1 except that a driven supply approach is employed where the output point is now the power supply common and the amplifier output is grounded. The high voltage pre-drivers 48, 48' are eliminated and the circuit is driven by an operational amplifier 80 which is powered from a regulated low voltage source, for example, +/− 15 volts supply. Idle current in the bias string 53 is supplied via from the +/− 15 V source supply via resistors 82, 82'. Of note, is that the critical circuit functions are the same as illustrated in FIG. 1, and the same reference numerals are applied to the elements having the similar functions. The driven supply approach illustrated in FIG. 2 is preferred since it eliminates the high voltage drivers 48-48', which operate above $V_H$. This greatly simplifies the power supply arrangement of the amplifier and is much more cost effective.

While there have been described what are at present considered to be the preferred embodiments of the present invention, it will be apparent to those skilled in the art that various changes and modifications may be made therein without departing from the invention, and it is intended in the appended claims to cover such changes and modifications as fall within the spirit and scope of the invention.

What is claimed is:

1. An amplifier switchably operative in a plurality of voltage modes depending on the level of the input signal comprising:
   circuit means for each voltage mode including a common driver for each level, and a plurality of output devices arranged in parallel, each operative at a selected voltage level and being coupled to the common driver for the corresponding voltage mode, one output device of each level being coupled in series to an output device of the next lower level; and
   switching diode means being coupled between series connected outputs of each output device.

2. The amplifier of claim 1 further comprising means for preventing saturation of the common driver and each output device in each level.

3. The amplifier of claim 2 wherein the means for preventing saturation in each level comprises paired diode means coupled to each level and a common terminal of said diode means coupled to the input.

4. The amplifier of claim 3 wherein the diode means comprises at least a plurality of diodes for providing multiple voltage drops in a lower voltage mode with respect to a higher voltage mode.

5. The amplifier of claim 1 further comprising regulator means coupled between the output of the amplifier and an input to the common driver of an elevated voltage mode for causing the driver and parallel connected output devices to be conductive before the input signal causes switching between the voltage modes.

6. The amplifier of claim 5 wherein the regulating means comprises a zener diode.

7. The amplifier of claim 5 wherein the regulator further comprises a series resistor for regulating current to the driver whereby the output devices are turned On at a relatively low level.

8. The amplifier of claim 5 wherein the regulator means comprises reactive means operative to produce a current to the driver at relatively high frequency.

9. The amplifier of claim 8 wherein the driver is turned on at said high frequency bypassing switching between voltage modes.

10. The amplifier of claim 1 wherein the output devices produce shared output current.

11. The amplifier of claim 1 wherein the output devices in a lower voltage mode include impedance means coupled in parallel to the output and wherein said impedance means acts as a load for each output device.

12. The amplifier of claim 1 wherein the driver and each output device comprises complementary pairs of solid state switching means coupled to a common output.

13. The amplifier of claim 1 wherein the driver and the output devices are Darlington connected.

14. The amplifier of claim 13 wherein the Darlington connected devices have a common base terminal coupled to an emitter of the driver.

15. An amplifier switchably operative in a plurality of voltage modes depending on the level of the input signal comprising:
   a saturable driver for each level, and at least one saturable output device operative at a selected voltage level and being coupled to the driver for the corresponding voltage mode, the at least one output device of each level being coupled in series to an output device of the next lower voltage level;
   switching diode means being coupled between the series connected outputs; and
   means for preventing saturation of the driver and output device in each level.

16. The amplifier of claim 15 wherein the means for preventing saturation in each level comprises paired diode means coupled to each level and a common terminal of said diode means coupled to the input.

17. The amplifier of claim 16 wherein the diode means comprises at least a plurality of diodes for providing multiple voltage drops in a lower voltage mode with respect to a higher voltage mode.

18. An amplifier switchably operative in a plurality of voltage modes depending on the level of the input signal comprising:
   a driver for each level, at least one output device operative at a selected voltage level relative to the input signal and being coupled to the driver for the corresponding mode, the at least one output device of each level being coupled in series to an output device of the next lower voltage level;
   switching diode means being coupled between the series connected outputs; and
   regulator means for causing the driver and output devices of each next higher voltage mode to turn on prior to the input signal achieving the selected voltage level.

* * * * *